(12) United States Patent
Zhang

(10) Patent No.: US 9,196,636 B2
(45) Date of Patent: Nov. 24, 2015

(54) TFT AND MANUFACTURING METHOD THEREOF, ARRAY SUBSTRATE AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Jinzhong Zhang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/537,233

(22) Filed: Nov. 10, 2014

(65) Prior Publication Data

US 2015/0243677 A1    Aug. 27, 2015

(30) Foreign Application Priority Data

Feb. 24, 2014    (CN) .......................... 2014 1 0062722

(51) Int. Cl.
| | | |
|---|---|---|
| *H01L 21/47* | (2006.01) | |
| *H01L 27/12* | (2006.01) | |
| *H01L 29/66* | (2006.01) | |
| *H01L 29/786* | (2006.01) | |

(52) U.S. Cl.
CPC .............. *H01L 27/124* (2013.01); *H01L 21/47* (2013.01); *H01L 29/66765* (2013.01); *H01L 29/78669* (2013.01)

(58) Field of Classification Search
CPC ... H01L 27/124; H01L 27/127; H01L 29/458; H01L 29/693; H01L 29/696; H01L 29/7869
USPC ........................................ 257/57, 72; 438/166
See application file for complete search history.

(56) References Cited

U.S. PATENT DOCUMENTS

| | | | |
|---|---|---|---|
| 8,022,405 B2* | 9/2011 | Yamazaki | ............... H01L 27/12 257/57 |
| 2006/0263957 A1* | 11/2006 | Wong | ................ H01L 21/02532 438/166 |
| 2012/0286272 A1* | 11/2012 | Ning | .................... H01L 29/7869 257/57 |
| 2015/0155305 A1* | 6/2015 | Wu | ....................... H01L 27/124 257/72 |

* cited by examiner

*Primary Examiner* — Michael Lebentritt
(74) *Attorney, Agent, or Firm* — Nath Goldberg & Meyer; Joshua B. Goldberg; Christopher Thomas

(57) ABSTRACT

The present invention provides a thin film transistor. An active layer of the thin film transistor comprises a plurality of active semiconductor sub-layers and a plurality of insulation sub-layers, which are stacked alternately. A source and a drain of the thin film transistor are electrically connected to the plurality of active semiconductor sub-layers. Correspondingly, the present invention further provides a method for manufacturing a thin film transistor, and an array substrate. The present invention can effectively increase channel current of the active layer in a thin film transistor, and solves the problem of small channel current resulted from low carrier mobility of the active layer.

20 Claims, 2 Drawing Sheets

TFT AND MANUFACTURING METHOD THEREOF, ARRAY SUBSTRATE AND DISPLAY DEVICE

FIELD OF THE INVENTION

The present invention relates to the field of display technology, and particularly to a thin film transistor and a manufacturing method thereof, an array substrate and a display device.

BACKGROUND OF THE INVENTION

In an existing TFT (Thin Film Transistor) array substrate, an active layer of a thin film transistor is usually made of hydrogenated amorphous silicon (a-Si:H). a-Si:H has advantages of good homogeneity, the capability of large-area deposition, good thin film stability, etc. However, the active layer made of a-Si:H has low carrier mobility. Because there are many defects in a-Si:H, most charges attracted by a gate in a TFT array substrate are captured in the defects and cannot conduct electricity, so that the carrier mobility of the active layer is less than $1$ $cm^2/(V*s)$, thus the channel current is relatively small, and it is difficult to meet the requirements of some high-performance display devices.

In the existing methods, an active layer made of low-temperature polycrystalline silicon materials or amorphous IGZO (indium gallium zinc oxide) may have higher carrier mobility. However, the low-temperature polycrystalline silicon is complicated in manufacturing process, high in manufacturing cost and poor in homogeneity and stability, comprehensive and stable crystallization of the low-temperature polycrystalline silicon is difficult to be realized, while the amorphous IGZO is high in manufacturing cost, immature in manufacturing process and low in yield.

SUMMARY OF THE INVENTION

Accordingly, an object of the present invention is to provide a thin film transistor and a manufacturing method thereof, and an array substrate, in order to increase the channel current of an active layer in the thin film transistor.

To achieve the above object, the present invention provides a thin film transistor comprising an active layer, wherein the active layer comprises a plurality of active semiconductor sub-layers and a plurality of insulation sub-layers, which are stacked alternately, and a source and a drain of the thin film transistor are electrically connected to the plurality of active semiconductor sub-layers.

For example, the active layer gradually becomes wider from top to bottom in a thickness direction thereof.

For example, the compactness of the plurality of active semiconductor sub-layers and the plurality of insulation sub-layers gradually increases from top to bottom in the thickness direction of the active layer.

For example, the thin film transistor comprises an ohmic contact layer. The ohmic contact layer is formed on the active layer and in contact with the plurality of active semiconductor sub-layers, and the source and the drain are formed on the ohmic contact layer.

For example, the etching rate of the material of the active semiconductor sub-layers is less than that of the material of the insulation sub-layers.

For example, the material of the active semiconductor sub-layers includes amorphous silicon.

For example, the material of the insulation sub-layers includes oxide of silicon and/or nitride of silicon.

For example, the thickness of each of the active semiconductor sub-layers is 200 Å-600 Å, and the thickness of each of the insulation sub-layers is 200 Å-600 Å.

Correspondingly, the present invention further provides an array substrate comprising the thin film transistor provided by the present invention.

Correspondingly, the present invention further provides a method for manufacturing a thin film transistor, comprising a step of forming an active layer of the thin film transistor and a step of forming a source and a drain of the thin film transistor, wherein the step of forming an active layer of the thin film transistor comprises:

alternately depositing a plurality of active semiconductor film layers and a plurality of insulation film layers; and forming a pattern including the active layer by a patterning process so that the active layer comprises a plurality of active semiconductor sub-layers and a plurality of insulation sub-layers which are stacked alternately; and wherein the step of forming a source and a drain of the thin film transistor comprises: enabling the source and the drain of the thin film transistor to be electrically connected to the plurality of active semiconductor sub-layers.

For example, the step of forming a pattern including the active layer by a patterning process so that the active layer comprises a plurality of active semiconductor sub-layers and a plurality of insulation sub-layers which are stacked alternately comprises: forming, by the patterning process, an active layer that gradually becomes wider from top to bottom in a thickness direction thereof.

For example, the step of alternately depositing a plurality of active semiconductor film layers and a plurality of insulation film layers comprises: by controlling the deposition pressure and the gas flow, allowing the compactness of the plurality of active semiconductor film layers and the plurality of insulation film layers to gradually become larger from top to bottom in the thickness direction of the active layer.

For example, the step of forming a pattern including the active layer by a patterning process so that the active layer comprises a plurality of active semiconductor sub-layers and a plurality of insulation sub-layers which are stacked alternately comprises:

applying photoresist on the plurality of active semiconductor film layers and the plurality of insulation film layers, exposing and developing the photoresist to form a pattern corresponding to the active layer, and then etching according to the pattern to form the pattern including the active layer.

For example, between the step of forming an active layer of the thin film transistor and the step of forming a source and a drain of the thin film transistor, the method for manufacturing a thin film transistor further comprises:

forming an ohmic contact layer on the active layer so that the ohmic contact layer is in contact with the plurality of active semiconductor sub-layers; and the step of forming a source and a drain of the thin film transistor comprises:

forming the source and the drain on the ohmic contact layer.

Correspondingly, the present invention further provides a display device comprising the array substrate provided by the present invention.

It can be seen that, by forming a plurality of active semiconductor sub-layers and insulation sub-layers which are stacked alternately in a thin film transistor, the present invention may form multiple channels in the thin film transistor, so that the channel current may be increased effectively, and the problem of small channel current resulted from low carrier mobility of the active layer may be solved. Compared with the prior art, the present invention is relatively low in process complexity and may effectively save cost.

BRIEF DESCRIPTION OF THE DRAWINGS

The accompanying drawings are used for providing further description of the present invention, and constitute a part of the specification. The accompanying drawings are used for illustrating the present invention in combination with the specific embodiments, but are not intended to limit the present invention. In the figures.

DETAILED DESCRIPTION OF THE EMBODIMENTS

The specific embodiments of the present invention will be described as below in details with reference to accompanying drawings. It will be appreciated that the specific embodiments described herein are used for describing and explaining the present invention merely, but are not intended to limit the present invention.

Figure 1:
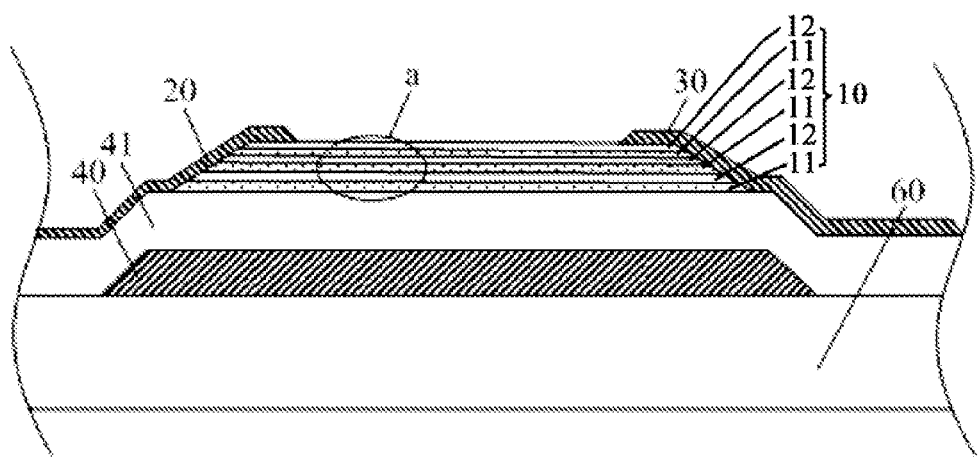
FIG. 1 is a schematic diagram of a thin film transistor according to an embodiment of the present invention.

In one aspect of the present invention, a thin film transistor is provided. As shown in FIG. 1, an active layer 10 of the thin film transistor may comprise a plurality of active semiconductor sub-layers 11 and a plurality of insulation sub-layers 12, which are stacked alternately. A source 20 and a drain 30 of the thin film transistor may be electrically connected to the plurality of active semiconductor sub-layers 11.

Specifically, as shown in FIG. 1, the thin film transistor may comprise a base substrate 60, and a gate 40 and a gate insulation layer 41 formed on the base substrate 60. The active layer 10 may be formed on the gate insulation layer 41, and may comprise a plurality of semiconductor sub-layers 11, and a plurality of insulation sub-layers 12 which are alternately stacked with the plurality of semiconductor sub-layers 11. The source 20 and the drain 30 may be electrically connected to the plurality of semiconductor sub-layers 11. It is to be noted that, in the multi-layered structure of the active layer 10, the bottommost layer or topmost layer may be an active semiconductor sub-layer 11 or an insulation sub-layer 12. For example, the bottommost layer is an active semiconductor sub-layer 11, and the topmost layer is an insulation sub-layer 12 for protecting the active semiconductor sub-layers 11 under it. In the present invention, it is enough to form a multi-layered structure by stacking a plurality of semiconductor sub-layers 11 and a plurality of insulation sub-layers 12, in which a plurality of interfaces with respect to the plurality of semiconductor sub-layers 11 are formed.

Figure 2:
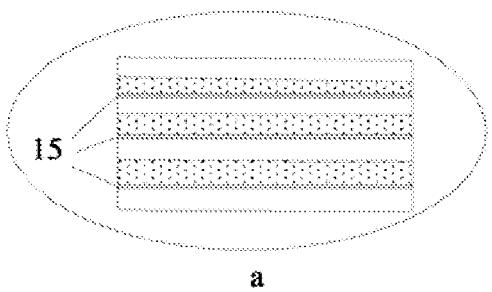
FIG. 2 is a schematic diagram of part a in FIG. 1.

An existing thin film transistor generally employs a single-channel mode, that is, only one active layer is provided. In such a single-channel mode, the channel current is generated in the active layer within a range of about 100 Å away from an interface between the active layer and a gate insulation layer, and the channel current is related to the defect density of the active layer and will not increase with the thickness of the active layer. In the thin film transistor provided by the above embodiment of the present invention, the active layer comprises a plurality of active semiconductor sub-layers and a plurality of insulation sub-layers which are stacked alternately, and the channel current may be generated at the interface between each of the active semiconductor sub-layers and the insulation sub-layer under the active semiconductor sub-layer, under the action of the gate voltage. Therefore, as shown in FIG. 2, the number of channels 15 in the thin film transistor is increased in the present invention, and a plurality of parallel channels 15 are formed, so that the channel current may be increased, and the problem of small channel current resulted from low carrier mobility of the active layer may be solved.

Figure 3:
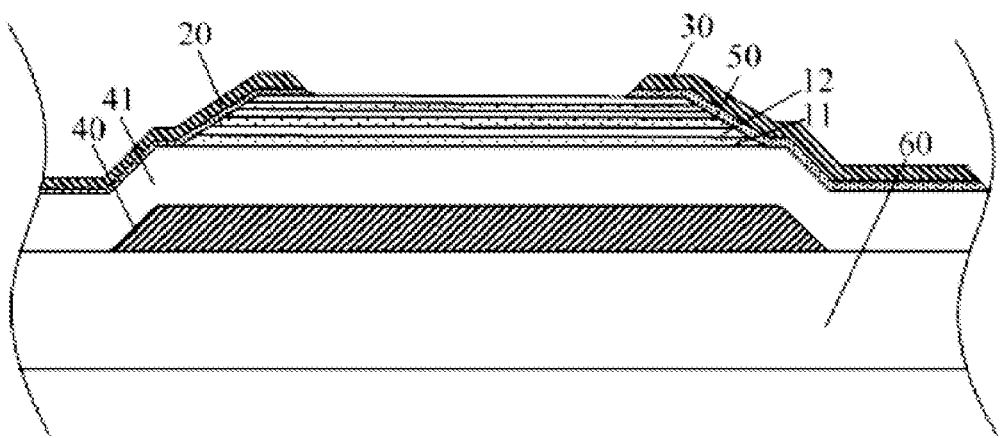
FIG. 3 is a schematic diagram of a thin film transistor according to another embodiment of the present invention.

Further, as shown in FIG. 3, the thin film transistor provided by an embodiment of the present invention may comprise an ohmic contact layer 50. The ohmic contact layer 50 may be formed on the active layer 10, wherein the active layer 10 may gradually become wider from top to bottom in a thickness direction thereof. The ohmic contact layer 50 may be in contact with the plurality of active semiconductor sub-layers 11. The source 20 and the drain 30 may be formed on the ohmic contact layer 50. The ohmic contact layer 50 is provided to improve the electrical conductivity between the active layer 10 and the source 20 as well as the drain 30. The active layer 10 is configured as a structure which gradually becomes wider from top to bottom in a thickness direction thereof, which facilitates contact between the ohmic contact layer 50 and the plurality of active semiconductor sub-layers 11, and then the source 20 and the drain 30 may be formed on the ohmic contact layer 50 to be electrically connected to the plurality of active semiconductor sub-layers 11 via the ohmic contact layer 50. For example, the material of the ohmic contact layer may include $N^+$ amorphous silicon.

It will be appreciated that, the forgoing description merely shows preferred embodiments of the present invention, the ohmic contact layer may be in contact with the plurality of active semiconductor sub-layers in other ways, or the source and the drain may be in direct contact with the plurality of active semiconductor sub-layers. For example, the active layer may be provided with a through hole therein, and the through hole may penetrate through each of the active semiconductor sub-layers. The ohmic contact layer or the source and the drain may comprise a portion which is arranged in the through hole, so as to be in contact with the plurality of active semiconductor sub-layers.

Further, the material of the active semiconductor sub-layers may include amorphous silicon (a-Si). That is, the active semiconductor sub-layers may be made of amorphous silicon, and for example, the active semiconductor sub-layers may be made of hydrogenated amorphous silicon (a-Si:H).

Further, the material of the insulation sub-layers may include oxide of silicon and/or nitride of silicon. That is, the insulation sub-layers may be made of oxide of silicon, nitride of silicon or a combination thereof. For example, the insulation sub-layers may be made of silicon nitride (SiNx).

Further, the thickness of each of the active semiconductor sub-layers is 200 Å-600 Å, and the thickness of each of the insulation sub-layers is 200 Å-600 Å. For example, the thickness of each of the active semiconductor sub-layers is about 400 Å, and the thickness of each of the insulation sub-layers is about 400 Å.

Further, the compactness of the plurality of active semiconductor sub-layers and the plurality of insulation sub-layers gradually increases from top to bottom.

In another aspect of the present invention, an array substrate is provided. The array substrate may comprise the above thin film transistor provided by the present invention. Specifically, the array substrate may comprise a plurality of pixel units, wherein at least one pixel unit may comprise the above thin film transistor provided by the present invention.

Figure 4:
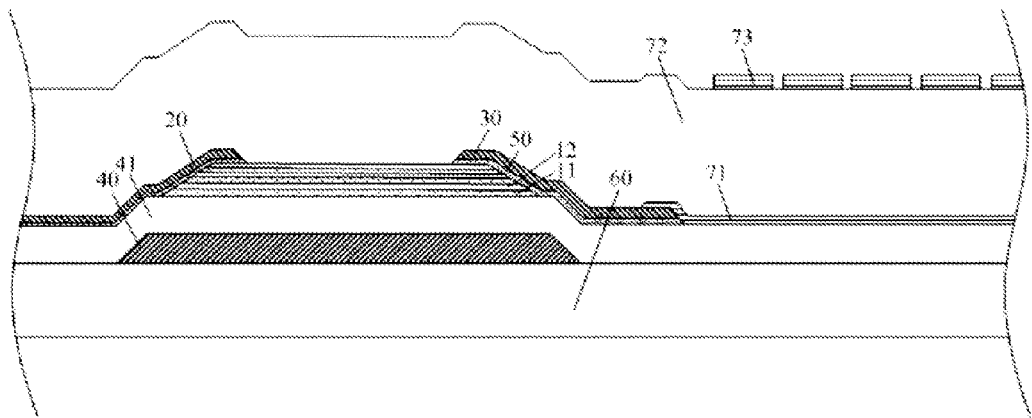
FIG. 4 is a schematic diagram of an array substrate according to an embodiment of the present invention.

As shown in FIG. 4, the array substrate provided by the present invention may further comprise a pixel electrode 71 connected to a drain 30, a passivation layer 72 and a common electrode 73 formed on the passivation layer 72. The pixel electrode 71, the passivation layer 72 and the common electrode 73 are of existing structures, and will not be elaborated here. It will be appreciated that, the thin film transistor in the example shown in FIG. 4 is of a bottom gate structure, and the present invention is also applicable to a thin film transistor of a top gate structure.

It should be understood by those skilled in the art that, the array substrate comprises a plurality of gate lines and a plurality of data lines, wherein the plurality of gate lines and the plurality of data lines are interlaced with each other to divide the array substrate into a plurality of pixel units.

Correspondingly, the present invention further provides a method for manufacturing a thin film transistor, comprising a step of forming an active layer of the thin film transistor and a step of forming a source and a drain of the thin film transistor, wherein the formed active layer comprises a plurality of active semiconductor sub-layers and a plurality of insulation sub-layers which are stacked alternately, and the formed source and drain are electrically connected to the plurality of active semiconductor sub-layers.

Figure 5:
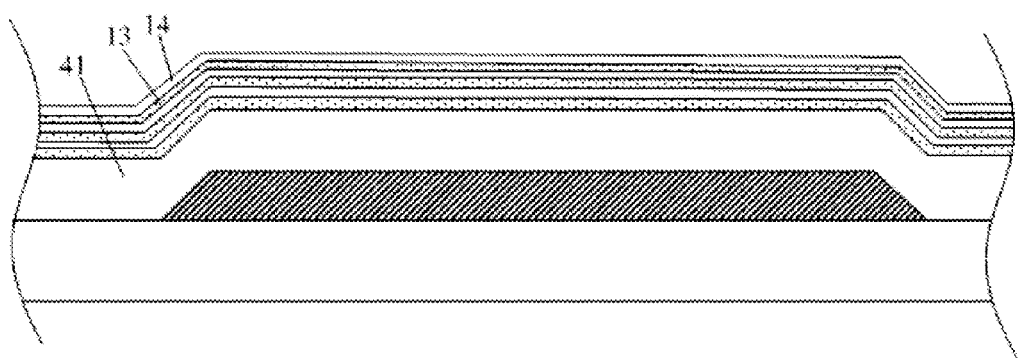
FIG. 5 is a schematic diagram of a structure formed by alternately depositing active semiconductor film layers and insulation film layers according to an embodiment of the present invention.
Figure 6:
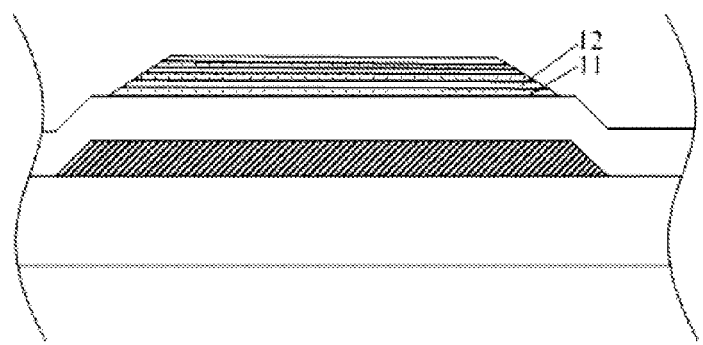
FIG. 6 is a schematic diagram of a structure formed by a plurality of active semiconductor sub-layers and a plurality of insulation sub-layers according to an embodiment of the present invention.

Further, during formation of the active layer, a plurality of active semiconductor film layers and a plurality of insulation film layers may be deposited alternately; then, a pattern including the active layer may be formed by a patterning process so that the active layer gradually becomes wider from top to bottom in a thickness direction thereof. Specifically, as shown in FIG. 5, a plurality of active semiconductor film layers 13 and a plurality of insulation film layers 14 may be alternately deposited on a gate insulation layer 41. This step may be implemented by alternately changing the gas for deposition in a CVD (Chemical Vapor Deposition) chamber. Subsequently, as shown in FIG. 6, a structure, in which a plurality of active semiconductor sub-layers 11 and a plurality of insulation sub-layers 12 gradually become wider from top to bottom in a thickness direction thereof, may be formed by the patterning process, so that it is convenient for the source and the drain to be electrically connected to the plurality of active semiconductor sub-layers 11. In this case, the patterning process may specifically comprise: applying photoresist on the plurality of active semiconductor film layers and the plurality of insulation film layers which are deposited alternately, and exposing and developing the photoresist to form a pattern corresponding to the active layer, and then etching according to the pattern to form the pattern including the active layer, so that the active layer is allowed to gradually become wider from top to bottom in the thickness direction thereof.

Further, during alternately depositing a plurality of active semiconductor film layers and a plurality of insulation film layers, by controlling the deposition pressure and the gas flow, the compactness of the plurality of active semiconductor film layers and the plurality of insulation film layers may be allowed to gradually become larger from top to bottom. That is, during deposition, by controlling the deposition pressure and the gas flow, the compactness of the plurality of active semiconductor film layers 13 and the plurality of insulation film layers 14 may be allowed to gradually become larger from top to bottom. Specifically, the compactness of the overall structure formed by the plurality of active semiconductor film layers 13 and the plurality of insulation film layers 14 may be allowed to gradually become larger from top to bottom. Because the etching rate of a film layer with higher compactness is relatively slow during etching in the patterning process, the deposition pressure and the gas flow are controlled to make the compactness of the plurality of active semiconductor film layers and the plurality of insulation film layers gradually become larger from top to bottom, thus facilitating formation of a structure, in which the active layer gradually becomes wider in the thickness direction thereof, by etching.

Certainly, in order to make the subsequently formed source and drain be in better contact with each of the active semiconductor sub-layers, the insulation sub-layers may be optionally made of material with larger etching rate than that of the material of the active semiconductor sub-layers, so that steps may be formed at edges of interfaces between the active semiconductor sub-layers and the insulation sub-layers, the source and the drain may be in better contact with each of the active semiconductor sub-layers, and thus the carrier mobility may be further improved.

It will be appreciated that, the active layer may be formed by other patterning processes (for example, printing, transfer printing, etc.) other than the above method.

Further, an ohmic contact layer, which is allowed to be in contact with the active semiconductor sub-layers, may be formed on the active layer at first, and then the source and the drain are formed on the ohmic contact layer. Specifically, an ohmic contact film layer and a source and drain metal film layer may be deposited on the active layer, and then a pattern including the ohmic contact layer, the source and the drain is formed by a patterning process.

The foregoing descriptions show the thin film transistor and the manufacturing method thereof, and the array substrate provided by the present invention. It can be seen that, by forming a plurality of active semiconductor sub-layers and insulation sub-layers which are stacked alternately in a thin film transistor, the present invention may generate multiple channels in the thin film transistor, so that the channel current may be increased, and the problem of small channel current resulted from low carrier mobility of the active layer may be solved. Compared with the prior art, the present invention is relatively low in process complexity and may effectively save cost.

In another aspect of the present invention, a display device is provided. The display device may comprise the above array substrate provided by the present invention.

It will be appreciated that, the foregoing embodiments are exemplary embodiments merely for describing the principle of the present invention, but the present invention is not limited thereto. A person of ordinary skill in the art may make various modifications and improvements without departing from the spirit and essence of the present invention. However, these modifications and improvements shall fall into the protection scope of the present invention.

The invention claimed is:
1. A thin film transistor, comprising an active layer, wherein,
the active layer comprises a plurality of active semiconductor sub-layers and a plurality of insulation sub-layers, which are stacked alternately; and a source and a drain of the thin film transistor are electrically connected to the plurality of active semiconductor sub-layers.

2. The thin film transistor according to claim 1, wherein the active layer gradually becomes wider from top to bottom in a thickness direction thereof.

3. The thin film transistor according to claim 2, wherein the compactness of the plurality of active semiconductor sub-layers and the plurality of insulation sub-layers gradually increases from top to bottom in the thickness direction of the active layer.

4. The thin film transistor according to claim 1, further comprising an ohmic contact layer, wherein the ohmic contact layer is formed on the active layer and in contact with the plurality of active semiconductor sub-layers, and the source and the drain are formed on the ohmic contact layer.

5. The thin film transistor according to claim 2, further comprising an ohmic contact layer, wherein the ohmic contact layer is formed on the active layer and in contact with the plurality of active semiconductor sub-layers, and the source and the drain are formed on the ohmic contact layer.

6. The thin film transistor according to claim 3, further comprising an ohmic contact layer, wherein the ohmic contact layer is formed on the active layer and in contact with the plurality of active semiconductor sub-layers, and the source and the drain are formed on the ohmic contact layer.

7. The thin film transistor according to claim 1, wherein the etching rate of the material of the active semiconductor sub-layers is less than the etching rate of the material of the insulation sub-layers.

8. The thin film transistor according to claim 2, wherein the etching rate of the material of the active semiconductor sub-layers is less than the etching rate of the material of the insulation sub-layers.

9. The thin film transistor according to claim 1, wherein the material of the active semiconductor sub-layers includes amorphous silicon.

10. The thin film transistor according to claim 1, wherein the material of the insulation sub-layers includes silicon oxide and/or silicon nitride.

11. The thin film transistor according to claim 1, wherein the thickness of each of the active semiconductor sub-layers is 200 Å-600 Å, and the thickness of each of the insulation sub-layers is 200 Å-600 Å.

12. An array substrate, comprising the thin film transistor according to claim 1.

13. A method for manufacturing a thin film transistor, comprising a step of forming an active layer of the thin film transistor and a step of forming a source and a drain of the thin film transistor,
wherein the step of forming an active layer of the thin film transistor comprises:
alternately depositing a plurality of active semiconductor film layers and a plurality of insulation film layers; and
forming a pattern including the active layer by a patterning process so that the active layer comprises a plurality of active semiconductor sub-layers and a plurality of insulation sub-layers which are stacked alternately; and
wherein the step of forming a source and a drain of the thin film transistor comprises: enabling the source and the drain of the thin film transistor to be electrically connected to the plurality of active semiconductor sub-layers.

14. The method for manufacturing a thin film transistor according to claim 13, wherein the step of forming a pattern including the active layer by a patterning process so that the active layer comprises a plurality of active semiconductor sub-layers and a plurality of insulation sub-layers which are stacked alternately comprises: forming, by the patterning process, an active layer that gradually becomes wider from top to bottom in a thickness direction thereof.

15. The method for manufacturing a thin film transistor according to claim 14, wherein the step of alternately depositing a plurality of active semiconductor film layers and a plurality of insulation film layers comprises: by controlling the deposition pressure and the gas flow, allowing the compactness of the plurality of active semiconductor film layers and the plurality of insulation film layers to gradually become larger from top to bottom in the thickness direction of the active layer.

16. The method for manufacturing a thin film transistor according to claim 13, wherein the step of forming a pattern including the active layer by a patterning process so that the active layer comprises a plurality of active semiconductor sub-layers and a plurality of insulation sub-layers which are stacked alternately comprises:
applying photoresist on the plurality of active semiconductor film layers and the plurality of insulation film layers, exposing and developing the photoresist to form a pattern corresponding to the active layer, and then etching according to the pattern to form the pattern including the active layer.

17. The method for manufacturing a thin film transistor according to claim 14, wherein the step of forming a pattern including the active layer by a patterning process so that the active layer comprises a plurality of active semiconductor sub-layers and a plurality of insulation sub-layers which are stacked alternately comprises:
applying photoresist on the plurality of active semiconductor film layers and the plurality of insulation film layers, exposing and developing the photoresist to form a pattern corresponding to the active layer, and then etching according to the pattern to form the pattern including the active layer.

18. The method for manufacturing a thin film transistor according to claim 15, wherein the step of forming a pattern including the active layer by a patterning process so that the active layer comprises a plurality of active semiconductor sub-layers and a plurality of insulation sub-layers which are stacked alternately comprises:
applying photoresist on the plurality of active semiconductor film layers and the plurality of insulation film layers, exposing and developing the photoresist to form a pattern corresponding to the active layer, and then etching according to the pattern to form the pattern including the active layer.

19. The method for manufacturing a thin film transistor according to claim 13, between the step of forming an active layer of the thin film transistor and the step of forming a source and a drain of the thin film transistor, further comprising:
forming an ohmic contact layer on the active layer so that the ohmic contact layer is in contact with the plurality of active semiconductor sub-layers; and
the step of forming a source and a drain of the thin film transistor comprises:
forming the source and the drain on the ohmic contact layer.

20. A display device, comprising the array substrate according to claim 12.

* * * * *